(12) United States Patent
Kida et al.

(10) Patent No.: US 12,000,737 B2
(45) Date of Patent: Jun. 4, 2024

(54) TEMPERATURE SENSOR AND HEATER UNIT

(71) Applicant: NHK SPRING CO., LTD., Yokohama (JP)

(72) Inventors: Naoya Kida, Yokohama (JP); Arata Tatsumi, Yokohama (JP); Kenji Sekiya, Yokohama (JP); Naoya Aikawa, Yokohama (JP); Masaya Takanashi, Yokohama (JP)

(73) Assignee: NHK SPRING CO., LTD., Yokohama (JP)

( * ) Notice: Subject to any disclaimer, the term of this patent is extended or adjusted under 35 U.S.C. 154(b) by 192 days.

(21) Appl. No.: 17/590,780

(22) Filed: Feb. 1, 2022

(65) Prior Publication Data

US 2022/0155156 A1   May 19, 2022

Related U.S. Application Data

(63) Continuation of application No. PCT/JP2020/028750, filed on Jul. 27, 2020.

(30) Foreign Application Priority Data

Aug. 2, 2019 (JP) ................. 2019-142836

(51) Int. Cl.
*G01K 7/06* (2006.01)
*G01K 7/14* (2006.01)
(Continued)

(52) U.S. Cl.
CPC .............. *G01K 7/06* (2013.01); *H10N 10/00* (2023.02); *H10N 10/10* (2023.02); *H10N 10/80* (2023.02); *G01K 7/14* (2013.01); *G05D 23/22* (2013.01)

(58) Field of Classification Search
CPC ............ G01K 7/06; G01K 7/14; H01N 10/80; H01N 10/00; H01N 10/10
See application file for complete search history.

(56) References Cited

U.S. PATENT DOCUMENTS 3,776,039 A   12/1973   Bowen
5,993,061 A   11/1999   Drouet
(Continued)

FOREIGN PATENT DOCUMENTS

JP   S49-128780 A   12/1974
JP   S55-155936 U   11/1980
(Continued)

OTHER PUBLICATIONS

Slifka et al., Thermal Condcutivity of Magnesium Oxide From Absolute, Steady-State Measurements, Journal of Research of the National Institute of Standards and Technology, vol. 103, No. 4, pp. 357-363 (Year: 1998).*

(Continued)

*Primary Examiner* — Jayne L Mershon
(74) *Attorney, Agent, or Firm* — HAUPTMAN HAM, LLP

(57) ABSTRACT

A temperature sensor includes a block body, a first thermocouple, and a second thermocouple. The first thermocouple includes a first strand, a second strand, a first insulator surrounding the first strand and the second strand, and a first metal sheath surrounding the first insulator. The second thermocouple includes a third strand, a fourth strand, a second insulator surrounding the third strand and the fourth strand, and a second metal sheath surrounding the second insulator. An end portion of each of the first thermocouple and the second thermocouple is buried in the block body.

12 Claims, 11 Drawing Sheets

(51) Int. Cl.
*H10N 10/00* (2023.01)
*H10N 10/10* (2023.01)
*H10N 10/80* (2023.01)
*G05D 23/22* (2006.01)

(56) References Cited

U.S. PATENT DOCUMENTS

| | | | |
|---|---|---|---|
| 6,550,963 | B2 | 4/2003 | Daily et al. |
| 7,871,198 | B2 | 1/2011 | Rempe et al. |
| 7,993,057 | B2 | 8/2011 | Aggarwal et al. |
| 10,101,215 | B2 | 10/2018 | Mella |
| 10,668,529 | B1 * | 6/2020 | Yurko .................... B22D 27/20 |
| 2008/0017060 | A1 | 1/2008 | Seidler et al. |
| 2015/0342671 | A1 | 12/2015 | Govari et al. |
| 2016/0084531 | A1 * | 3/2016 | Cara ....................... F24S 20/20 |
| | | | 126/597 |
| 2016/0178448 | A1 * | 6/2016 | Mella ....................... G01K 1/08 |
| | | | 29/613 |
| 2016/0320249 | A1 * | 11/2016 | Reiman ................... G01K 7/02 |
| 2019/0011315 | A1 | 1/2019 | Del Bianco |
| 2019/0355923 | A1 * | 11/2019 | Kishimoto ............ H10K 50/84 |
| 2020/0124452 | A1 * | 4/2020 | Bitto ....................... G01F 15/02 |
| 2021/0033124 | A1 * | 2/2021 | Okuno ..................... F16B 5/08 |

FOREIGN PATENT DOCUMENTS

| | | |
|---|---|---|
| JP | S58-111731 A | 7/1983 |
| JP | S59-48628 A | 3/1984 |
| JP | H1-38556 Y2 | 11/1989 |
| JP | H4-45934 U | 4/1992 |
| JP | H9-33358 A | 2/1997 |
| JP | 2001-135715 A | 5/2001 |
| JP | 2002-5753 A | 1/2002 |
| JP | 2003-130737 A | 5/2003 |
| JP | 2004-165085 A | 6/2004 |
| JP | 4098112 B2 | 6/2008 |

OTHER PUBLICATIONS

English translation of Written Opinion issued dated Sep. 8, 2020, for corresponding International Patent Application PCT/JP2020/028750.
Extended European Search Report dated Jul. 6, 2023, for corresponding European Patent Application No. 20849555.6 (47 pages).
International Search Report dated Sep. 8, 2020, for corresponding International Patent Application No. PCT/JP2020/028750, along with an English translation.
Written Opinion dated Sep. 8, 2020, for corresponding International Patent Application No. PCT/JP2020/028750.
Office Action dated Jan. 12, 2021, for Japanese Patent Application No. 2019-142836, along with an English machine translation.
Decision to Grant a Patent dated Mar. 2, 2021, for Japanese Patent Application No. 2019-142836, along with an English machine translation.
Office Action dated Jun. 7, 2021, for corresponding Taiwanese Patent Application No. 109125819, along with an English translation.

* cited by examiner

100a

100b

100c

100d

100e

TEMPERATURE SENSOR AND HEATER UNIT

CROSS REFERENCE TO RELATED APPLICATIONS

This application is based on and claims the benefit of priority from the prior Japanese Patent Application No. 2019-142836, filed on Aug. 2, 2019, and the PCT Application No. PCT/JP2020/028750, filed on Jul. 27, 2020, the entire contents of which are incorporated herein by reference.

BACKGROUND OF THE INVENTION

Field

One embodiment of the present invention relates to a temperature sensor. Further, one embodiment of the present invention relates to a heater unit including the temperature sensor.

Description of the Related Art

A semiconductor device which is mounted on an electronic device utilizes the semiconductor characteristics of silicon and the like. The semiconductor device is composed of various patterned semiconductor films, insulating films, and conductive films that are stacked over a substrate. These films are formed using a vaper deposition method, a sputtering method, a chemical vapor deposition (CVD) method or chemical reactions of substrates, and the like, and are patterned by a photolithography process. The photolithography process includes forming a resist film on a film to be patterned, exposing the resist film, forming a resist mask by development, partially removing the film by etching, and removing the resist mask.

The characteristics of the film described above are greatly influenced by the conditions for forming or patterning the film. One of the conditions is the temperature of the substrate. Therefore, when processing the semiconductor device, it is important to control the temperature of the substrate. The temperature of the substrate is controlled by measuring the temperature of a heater unit in contact with the substrate, and controlling the heater in the heater unit based on the measured temperature. For example, Japanese Patent Application Laid-Open No. 2004-165805 and Japanese Patent No. 4098112 disclose a heater unit including a sheath heater and a sheath thermocouple.

SUMMARY OF THE INVENTION

A temperature sensor according to an embodiment of the present invention includes a block body, a first thermocouple, and a second thermocouple. The first thermocouple includes a first strand, a second strand, a first insulator surrounding the first strand and the second strand, and a first metal sheath surrounding the first insulator. The second thermocouple includes a third strand, a fourth strand, a second insulator surrounding the third strand and the fourth strand, and a second metal sheath surrounding the second insulator. An end portion of each of the first thermocouple and the second thermocouple is buried in the block body.

A heater unit according to an embodiment of the present invention includes a temperature sensor. The temperature sensor according to an embodiment of the present invention includes a block body, a first thermocouple, and a second thermocouple. The first thermocouple includes a first strand, a second strand, a first insulator surrounding the first strand and the second strand, and a first metal sheath surrounding the first insulator. The second thermocouple includes a third strand, a fourth strand, a second insulator surrounding the third strand and the fourth strand, and a second metal sheath surrounding the second insulator. An end portion of each of the first thermocouple and the second thermocouple is buried in the block body.

DESCRIPTION OF EMBODIMENTS

Figure 1A:
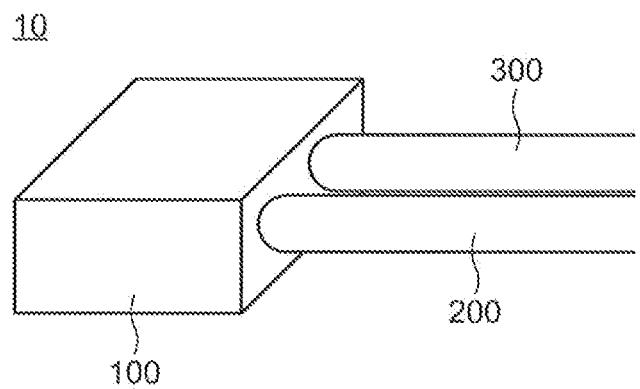
FIG. 1A is a schematic perspective view of a temperature sensor according to an embodiment of the present invention.

A heater unit not only requires that the temperature of a substrate is measured, but also overheating of a heater include in the heater unit is prevented. Therefore, a temperature sensor of the heater unit is often provided with a plurality of thermocouples. In a sheath thermocouple, although it is possible to arrange multiple thermocouples in one metal sheath, a sheath outer diameter of the metal sheath becomes large and the metal sheath cannot be bent, thereby a position where the temperature sensor can be installed in the heater unit is limited.

In view of the above problems, one of the objects of an embodiment of the present invention is to provide a temperature sensor that can accurately measure the temperature of an object to be measured and can be freely installed. Further, one of the objects of an embodiment of the present invention is to provide a heater unit that can accurately measure the temperature of an object to be measured and control a heater.

Hereinafter, each embodiment of the present invention is described with reference to the drawings. However, the present invention can be implemented in various configurations without departing from the gist thereof, and should not be construed as being limited to the descriptions of the embodiments exemplified below.

For the sake of clarity of the description, although the drawings may be schematically represented with respect to the widths, thicknesses, shapes, and the like of the respective portions in comparison with actual embodiments, they are merely examples and are not intended to limit the interpretation of the present invention. Further, in the present specification and each figure, elements having the same functions as those described in previously mentioned figures may be designated by the same reference numerals, and duplicate explanations may be omitted.

In the present specification and drawings, the same reference numerals are used when describing the same or similar plurality of configurations as a whole, and the same reference numerals may be attached with an uppercase or lowercase letter of the alphabet when describing each of the plurality of configurations separately. When describing multiple parts of one composition separately, the same reference numerals with a hyphen and a natural number are used.

First Embodiment

A temperature sensor 10 according to an embodiment of the present invention is described with reference to FIGS. 1A to 2B.

[Structure]

Figure 1B:
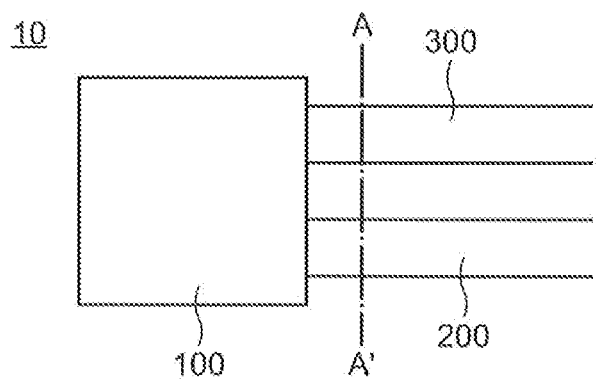
FIG. 1B is a schematic top view of a temperature sensor according to an embodiment of the present invention.
Figure 1C:
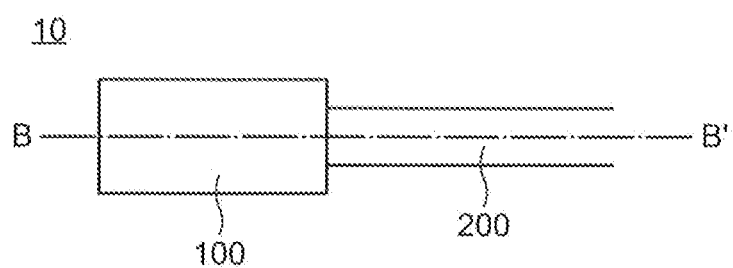
FIG. 1C is a schematic side view of a temperature sensor according to an embodiment of the present invention.

FIGS. 1A to 1C are respectively a schematic perspective view, a schematic top view, and a schematic side view of a temperature sensor 10 according to the embodiment of the present invention. As shown in FIGS. 1A to 1C, the temperature sensor 10 includes a block body 100, a first thermocouple 200, and a second thermocouple 300. An end portion of each of the first thermocouple 200 and the second thermocouple 300 is buried in the block body 100.

The block body 100 is in contact with an object to be measured. Further, the first thermocouple 200 and the second thermocouple 300 are buried in the block body 100, and directly measure a temperature of the block body 100. That is, the temperature sensor 10 measures the temperature of the block body 100 in contact with the object to be measured by using the first thermocouple 200 and the second thermocouple 300. When the material of the block body 100 is the same as the material of the object to be measured or has a higher thermal conductivity than the material of the object to be measured, the temperature of the object to be measured and the temperature of the block body 100 are substantially the same. Therefore, the temperature of the object to be measured can be obtained by measuring the temperature of the block body 100.

The size of the block body 100 can be appropriately determined depending on the number of thermocouples to be buried. Generally, when the block body 100 is large, heat capacity is large, so that heat conduction from the object to be measured to the block body 100 is lowered. Therefore, in order to bring the temperature of the block body 100 close to the temperature of the object to be measured, the block body 100 should be small. The length of one side of the block body 100 may be, for example, 15 mm or less, 10 mm or less, or 5 mm or less.

In FIGS. 1A to 1C, although the number of thermocouples buried in the block body 100 is two, the configuration of the block body 100 is not limited to this. The number of thermocouples buried in the block body 100 may be at least two or more. When two or more thermocouples are provided in the temperature sensor 10, an accurate temperature measurement and temperature control of the object to be measured become possible. For example, the first thermocouple 200 can be used as a thermocouple for measuring the temperature of the object to be measured, and the second thermocouple 300 can be used as a thermocouple for preventing overheating of a heater. In another example, the second thermocouple 300 can be used as a spare thermocouple of the first thermocouple 200. Unlike the present embodiment, when two thermocouples are arranged at different locations of the object to be measured without using the block body 100, heat conduction to the thermocouple may differ depending on the shape of the object to be measured. In this case, even though the two thermocouples measure the temperature of the same object to be measured, the temperature measured by each of the two thermocouples is different. On the other hand, in the temperature sensor 10 according to the present embodiment, end portions of the first thermocouple 200 and the second thermocouple 300 are buried in the same block body 100, and the temperature of the object to be measured is measured through the temperature of the block body 100. Therefore, the difference between the temperature measured by the first thermocouple 200 and the temperature measured by the second thermocouple 300 can be reduced.

Further, different types of thermocouples can be used for the first thermocouple 200 and the second thermocouple 300. For example, a thermocouple having a measurement temperature range of less than 500 degrees is used as the first thermocouple 200, and a thermocouple having a measurement temperature range of 500 degrees or more is used as the second thermocouple 300. In this case, the first thermocouple 200 is used when the measurement temperature is less than 500 degrees and the second thermocouple 300 is used when the measurement temperature greater than or equal to 500 degrees. This allows the measurement temperature range of the temperature sensor 10 to be widened. Furthermore, in the temperature near the upper limit or the lower limit of the measurement temperature range of the thermocouple, the temperature measured by the thermocouple and the actual temperature are often different. In this case, the second thermocouple 300 is used to measure the temperature near the upper limit or the lower limit of the measurement temperature range of the first thermocouple 200. This allows the temperature sensor 10 to compensate for the temperature measured by the first thermocouple 200.

Figure 2A:
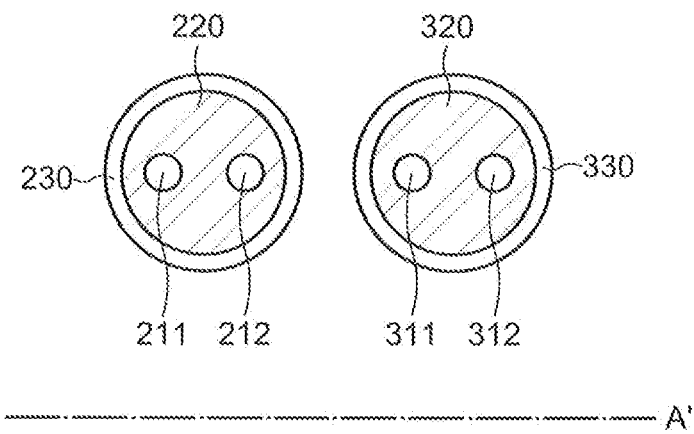
FIG. 2A is a schematic cross-sectional view of a temperature sensor according to an embodiment of the present invention.

A schematic cross-sectional view cut along the line A-A' of FIG. 1B is shown in FIG. 2A. FIG. 2A is a schematic cross-sectional view of the first thermocouple 200 and the second thermocouple 300 of the temperature sensor 10 according to the present embodiment. The first thermocouple 200 includes a first strand 211, a second strand 212, a first insulator 220, and a first metal sheath 230. The second thermocouple 300 includes a third strand 311 and a fourth strand 312, a second insulator 320, and a second metal sheath 330.

The first thermocouple 200 includes the first strand 211 and the second strand 212 in the first metal sheath 230. Further, by filling the first metal sheath 230 with the first insulator 220, each of the first strand 211, the second strand 212, and the first metal sheath 230 is insulated.

Since the configuration of the second thermocouple 300 is the same as the configuration of the first thermocouple 200, the description thereof is omitted here.

The first thermocouple 200 and the second thermocouple 300 are so-called sheathed thermocouples. The sheath thermocouple has a small sheath outer diameter and is flexible. Therefore, the sheath thermocouple can be bent. Further, since two strands of the sheath thermocouple are protected by a metal sheath and an insulator, they have excellent impact resistance and corrosion resistance.

Each of the first metal sheath 230 and the second metal sheath 330 can include not only two strands but also more strands. However, if the number of strands included in one metal sheath is large, the outer sheath diameter of the metal sheath becomes large, so that the flexibility of the thermocouple decreases. In addition, the block body 100 in which the thermocouple is buried also becomes large. Therefore, when the thermocouple is bent and arranged, or when the thermocouple is arranged with respect to a minute object to be measured, the first thermocouple 200 and the second thermocouple 300 of the temperature sensor 10 preferably include only two strands (single element).

Figure 2B:
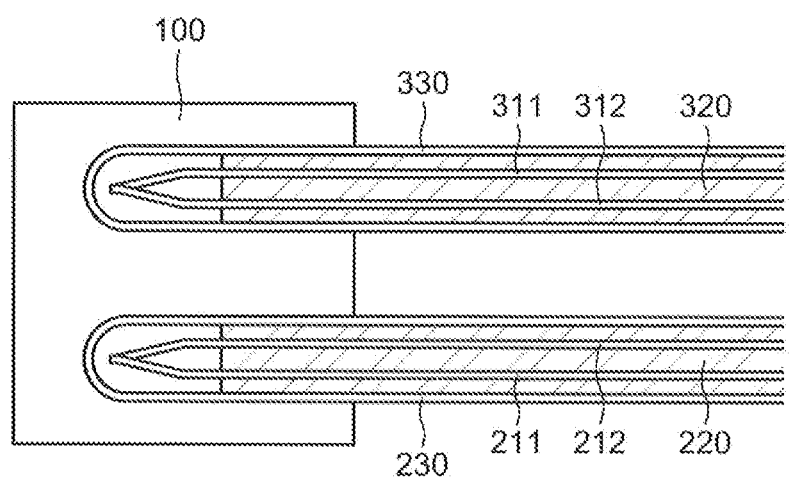
FIG. 2B is a schematic cross-sectional view of a temperature sensor according to an embodiment of the present invention.
Figure 10:
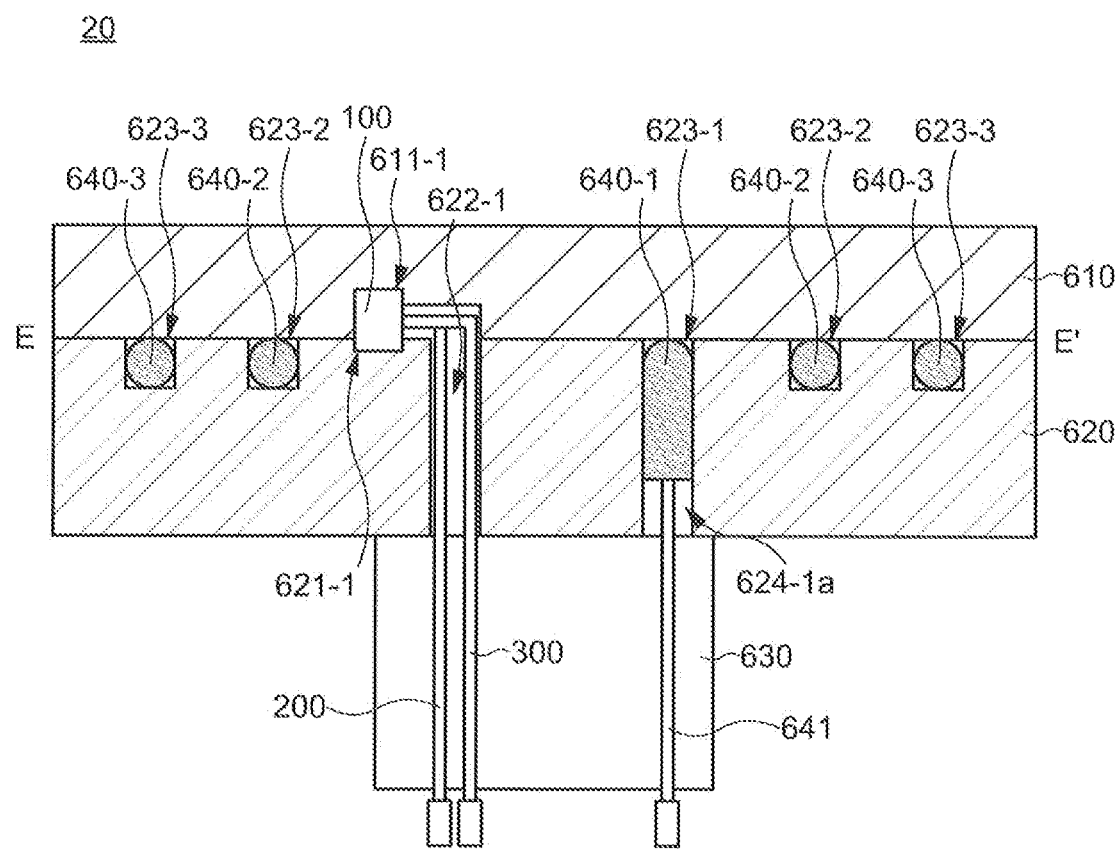
FIG. 10 is a schematic cross-sectional view of the heater unit according to the embodiment of the present invention.

A schematic cross-sectional view cut along the line B-B' of FIG. 10 is shown in FIG. 2B. FIG. 2B is a schematic cross-sectional view of a temperature sensor 10 according to an embodiment of the present invention.

In the end portion of the first thermocouple 200, the first metal sheath 230 is closed and buried in the block 100. Inside the closed portion of the first metal sheath 230, the first strand 211 and the second strand 212 are joined. Further, although the first insulator 220 is filled in the first metal sheath 230 so as to have a hollow part in the closed portion of the first metal sheath 230, the configuration of the first insulator 220 is limited to this. The first insulator 220 may be filled in all of the first metal sheath 230. In addition, in order to enhance heat conduction from the block body 100 to the first thermocouple 200, the first insulator 220 is preferably filled in at least a part of the portion of the first metal sheath 230 buried in the block body 100.

Since the configuration of the second thermocouple 300 is the same as the configuration of the first thermocouple 200, the description thereof is omitted here.

The end portions of the first thermocouple 200 and the second thermocouple 300 are brazed and bonded to an opening provided in the block body 100. For example, aluminum, copper containing trace amounts of phosphorus, alloys containing aluminum, alloys containing silver, copper, and zinc, alloys containing copper and zinc, alloys containing titanium, copper, and nickel, alloys containing titanium, zirconium, and copper, alloys containing titanium, zirconium, copper, and nickel, or the like can be used as a brazing material. The bonding of the first thermocouple 200 and the second thermocouple 300 to the block body 100 is not limited to brazing. Instead of brazing, the first thermocouple 200 and the second thermocouple 300 may be joined by welding, caulking, or the like.

[Material]

The block body 100 is in contact with the object to be measured, conducts heat from the object to be measured, and conducts heat to the first thermocouple 200 and the second thermocouple 300. Therefore, although the material of the block body 100 is preferably the same as the material of the object to be measured, the material is not limited to this. The block body 100 is preferably a metal having high thermal conductivity. A metal having a thermal conductivity of 10 W/mK or more and 430 W/mK or less can be selected as the material of the block body 100. In the comparison of materials, the thermal conductivity of the material of the block body 100 is preferably 80% or more of the thermal conductivity of the material of the object to be measured with which the block body 100 is in contact. Further, when the block body 100 is buried in the object to be measured, it is preferable that the metal further has a coefficient of thermal expansion of $3 \times 10^{-6}$/K or more and $25 \times 10^{-6}$/K or less. For example, a metal such as aluminum, titanium, stainless steel, or an alloy thereof can be used as the metal of the block body 100.

Further, ceramic can be used as the material of the block body 100. By using ceramic as the material of the block body 100, the temperature sensor 10 has excellent corrosion resistance. For example, silicon carbide, aluminum nitride, aluminum oxide, or silicon nitride can be used as the ceramic of the block body 100. In the comparison of the hardness of the materials, the hardness of the material of the block body 100 may be larger than the hardness of the material of the object to be measured with which the block body 100 is in contact.

Different metals are used for the first strand 211 and the second strand 212, or the third strand 311 and the fourth strand 312. Here, for convenience, the first strand 211 and the third strand 311 are defined as positive poles, and the second strand 212 and the fourth strand 312 are defined negative poles. For example, the combination of metals of the first strand 211 and the second strand 212, or the third strand 311 and the fourth strand 312 are as shown in Table 1. Since the measurable temperature range differs depending on the metal, a thermocouple in which an appropriate metal material is combined may be used according to the temperature range in which the object to be measured is measured.

TABLE 1

| type | Positive pole first strand or third strand | Negative pole second strand or fourth strand |
|---|---|---|
| B | platinum rhodium alloy containing 30% rhodium | platinum rhodium alloy containing 6% rhodium |
| R | platinum rhodium alloy containing 13% rhodium | platinum |
| S | platinum rhodium alloy containing 10% rhodium | platinum |
| N | alloy containing nickel, chromium, and silicon | alloy containing nickel and silicon |
| K | alloy containing nickel and chromium | alloy containing nickel and alminum |
| E | alloy containing nickel and chromium | alloy containing copper and nickel |
| J | iron | alloy containing copper and nickel |
| T | copper | alloy containing copper and nickel |

The first insulator 220 is provided to prevent the first strand 211, the second strand 212, and the first metal sheath 230 from being in contact with each other and causing a short circuit. Similarly, the second insulator 320 is provided to prevent the third strand 311 and the fourth strand 312, and the second metal sheath 330 from being in contact with each other and causing a short circuit. A material of the first insulator 220 and the second insulator 320 can be selected from insulating materials having a thermal conductivity of 10 W/mK or more and 300 W/mK or less. For example, magnesium oxide, aluminum oxide, silicon oxide, zirconium oxide, tantalum oxide, boron nitride, aluminum nitride, silicon nitride, zirconium nitride, titanium nitride, tantalum nitride, molybdenum nitride, niobium nitride, or the like can be used as an insulating material of the first insulator 220 and the second insulator 320. The first insulator 220 and the second insulator 320 are composed of a powder of the above materials or fine particles obtained by sintering and crushing the powder. That is, the powder or fine particles of the above materials are filled in the first metal sheath 230 and the second metal sheath 330 to form the first insulator 220 and the second insulator 320.

The first metal sheath 230 and the second metal sheath 330 are preferably metals having high thermal conductivity in order to efficiently conduct heat from the block body 100. Further, the first metal sheath 230 and the second metal sheath 330 protect the first strand 211, the second strand 212, the third strand 311, and the fourth strand 312 from a corrosive atmosphere or an oxidizing atmosphere. A metal having a thermal conductivity of 10 W/mK or more and 430 W/mK or less can be selected. For example, metals such as aluminum, titanium, nickel, iron, chromium, niobium, molybdenum, or alloys thereof can be used as the first metal sheath 230 and the second metal sheath 330. More specifically, nickel-chromium-based heat-resistant alloys or austenitic stainless steel can be used as the material of the first metal sheath 230 and the second metal sheath 330.

In the temperature sensor 10 according to the present embodiment, since one end portion of each of the plurality of thermocouples (for example, the first thermocouple 200 and the second thermocouple 300) is buried in the block body 100, the temperature variation between each thermocouple is small. On the other hand, the other end portion of each of the plurality of thermocouples is free. Since the outer sheath diameter of each thermocouple is small and the thermocouple can be bent, the other end portion of each thermocouple can be freely arranged. Therefore, the temperature sensor 10 can accurately measure the temperature of the object to be measured by using a plurality of thermocouples, and each thermocouple of the temperature sensor 10 can be freely arranged.

[Modification 1]

A modification of the temperature sensor 10 according to the present embodiment is described with reference to FIGS. 3A and 3B. Here, a modification of the configuration of the first thermocouple 200 and the second thermocouple 300 is mainly described.

Figure 3A:
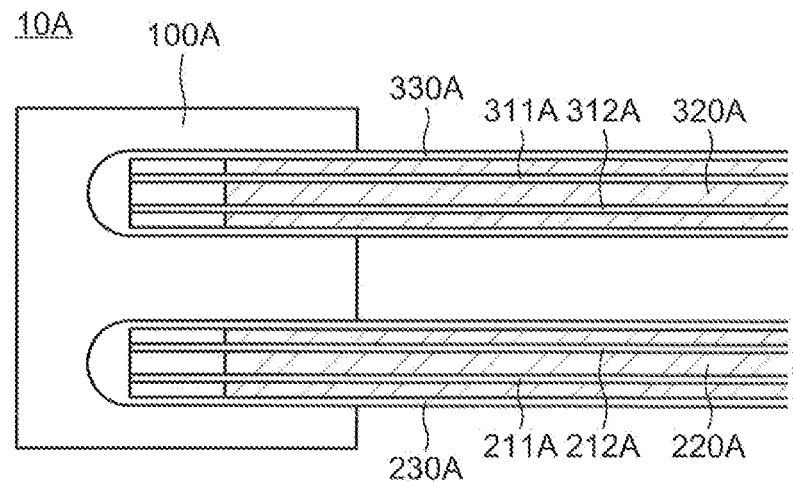
FIG. 3A is a schematic cross-sectional view of a temperature sensor according to an embodiment of the present invention.

FIG. 3A is a schematic cross-sectional view of a temperature sensor 10A according to the present embodiment. The temperature sensor 10A includes a block body 100A, a first thermocouple 200A, and a second thermocouple 300A. The first thermocouple 200A includes a first strand 211A, a second strand 212A, a first insulator 220A, and a first metal sheath 230A. The second thermocouple 300A includes a third strand 311A, a fourth strand 312A, a second insulator 320A, and a second metal sheath 330A. Each end portion of the first thermocouple 200A and the second thermocouple 300A is buried in the block body 100A.

In the temperature sensor 10A, the end portions of the first strand 211A and the second strand 212A are joined to a closed portion of the first metal sheath 230A. The first strand 211A and the second strand 212A may be joined together when the first metal sheath 230A is closed, or may be joined after the first metal sheath 230A is closed.

Since the configurations of the third strand 311A and the fourth strand 312A are the same as the configurations of the first strand 211A and the second strand 212A, the description thereof is omitted here.

In the temperature sensor 10A according to the present embodiment, the first strand 211A and the second strand 212A are in direct contact with the first metal sheath 230A, and the third strand 311A and the fourth strand 312A are in direct contact with the second metal sheath 330A. Therefore, since the heat conduction from the block body 100 to the first strand 211A, the second strand 212A, the third strand 311A, and the fourth strand 312A is good, the temperature sensor 10A has excellent responsiveness.

Figure 3B:
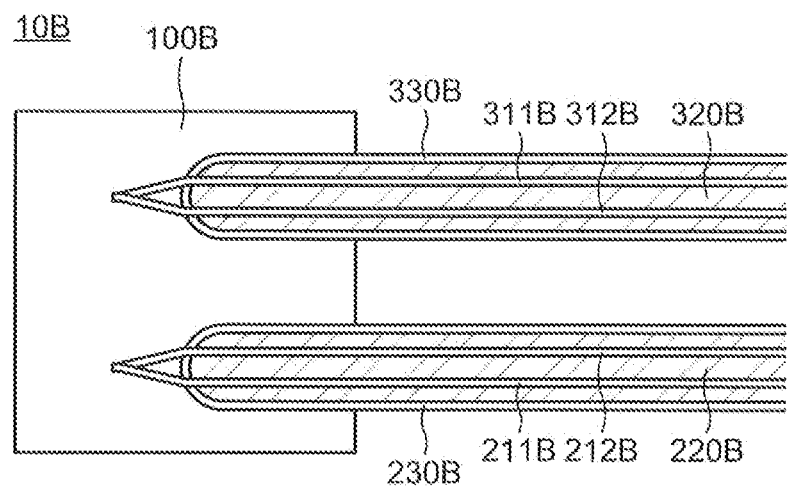
FIG. 3B is a schematic cross-sectional view of a temperature sensor according to an embodiment of the present invention.

FIG. 3B is a schematic cross-sectional view of a temperature sensor 10B according to the present embodiment. The temperature sensor 10B includes a block body 100B, a first thermocouple 200B, and a second thermocouple 300B. The first thermocouple 200B includes a first strand 211B, a second strand 212B, a first insulator 220B, and a first metal sheath 230B. The second thermocouple 300B includes a third strand 311B, a fourth strand 312B, a second insulator 320B, and a second metal sheath 330B.

In the first thermocouple 200B of the temperature sensor 10B, an end portion of each of the first strand 211B and the second strand 212B projects out from a closed portion of the first metal sheath 230B and is exposed. Further, outside the first metal sheath 230B, the first strand 211B and the second strand 212B are joined.

Since the configuration of the second thermocouple 300B is the same as the configuration of the first thermocouple 200B, the description thereof is omitted.

Further, at the end portion of each of the first thermocouple 200B and the second thermocouple 300B, the first strand 211B, the second strand 212B, the third strand 311B, and the fourth strand 312B are exposed and buried in the block body 100B. The first thermocouple 200B and the second thermocouple 300B can be inserted into openings provided in the block body 100B and bonded to the block body 100B. Further, the block body 100B is divided into two portions, the first thermocouple 200B and the second thermocouple 300B are sandwiched between the two portions, and the two portions of the block body 100B are bonded, and at the same time, the first thermocouple 200B and the second thermocouple 300B may be bonded to the block body 100B.

In the temperature sensor 10B according to the present embodiment, the first strand 211B and the second strand 212B of the first thermocouple 200B and the third strand 311B and the fourth strand 312fB of the second thermocouple 300B are in direct contact with the block body 100B. Therefore, since the thermal conductivity from the block body 100B to the first strand 211B, the second strand 212B, the third strand 311B, and the fourth strand 312B is good, the temperature sensor 10B has excellent responsiveness. Further, since the exposed portions of the first strand 211B, the second strand 212B, the third strand 311B, and the fourth strand 312B are covered with the block body 100B, they have excellent impact resistance and corrosion resistance.

[Modification 2]

A modification of the temperature sensor 10 according to the present embodiment is described with reference to FIGS. 4A to 4E. Here, a modification of the configuration of the block body 100 is mainly described.

FIG. 4A to 4E are schematic perspective views of block bodies 100a to 100e that can be applied to the temperature sensor 10 according to the present embodiment, respectively.

Figure 4A:
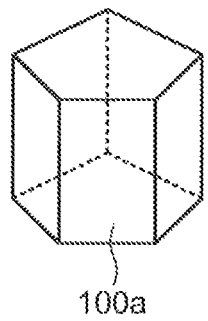
FIG. 4A is a schematic perspective view of a block body that can be applied to a temperature sensor according to an embodiment of the present invention.

A shape of the block body 100a shown in FIG. 4A is a polygonal prism. The polygonal prism is provided with a quadrangular side surface with respect to a bottom surface of the polygonal prism. In FIG. 4A, although the bottom surface of the polygonal prism is pentagonal, the present invention is not limited to this. The bottom surface of the polygonal prism can be appropriately selected according to the shape of the object to be measured, such as a triangle, a quadrangle, or a hexagon. Further, the quadrangular side surface of the polygonal prism is, for example, a square, a rectangle, a parallelogram, or a rhombus. The polygonal prism may be a right-angled prism or an oblique prism. If the sides of the polygonal prism include a parallelogram or rhombus, the polygonal prism is an oblique prism.

In the block body 100a, a position in which the first thermocouple 200 and the second thermocouple 300 are buried may be the bottom surface or the side surface of the polygonal prism.

Figure 4B:
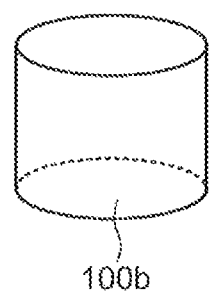
FIG. 4B is a schematic perspective view of a block body that can be applied to a temperature sensor according to an embodiment of the present invention.

The shape of the block body 100b shown in FIG. 4B is a cylinder. That is, the block body 100b includes a circular bottom surface and a curved side surface. In the block body 100b, a position in which the first thermocouple 200 and the second thermocouple 300 are buried may be the bottom surface or the side surface of the cylinder.

Figure 4C:
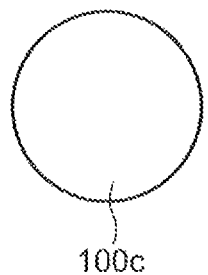
FIG. 4C is a schematic perspective view of a block body that can be applied to a temperature sensor according to an embodiment of the present invention.

The shape of the block body 100c shown in FIG. 4C is a sphere. Since a surface of the block body 100c can be in contact with the object to be measured evenly, heat conduction from the object to be measured to the block body 100c becomes homogeneous.

Figure 4D:
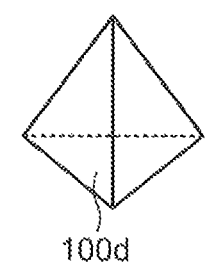
FIG. 4D is a schematic perspective view of a block body that can be applied to a temperature sensor according to an embodiment of the present invention.

The shape of the block body 100d shown in FIG. 4D is a polygonal pyramid. In FIG. 4D, although a bottom surface of the polygonal pyramid is a triangle, the present invention is not limited to this. The bottom surface of the polygonal pyramid can be appropriately selected according to the shape of the object to be measured, such as a quadrangle, a pentagon, or a hexagon. Further, the polygonal pyramid may be a straight pyramid in which a perpendicular line from the apex coincides with the center of gravity of the bottom surface, or may be an oblique pyramid in which a perpendicular line from the apex does not coincide with the center of gravity of the bottom surface.

Figure 4E:
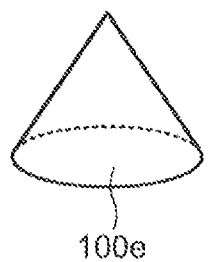
FIG. 4E is a schematic perspective view of a block body that can be applied to a temperature sensor according to an embodiment of the present invention.

The shape of the block body 100e shown in FIG. 4E is a cone. The cone may be a straight cone in which a perpendicular line from the apex coincides with the center of the circle on the bottom surface, or may be an oblique cone in which a perpendicular line from the apex does not coincide with the center of the circle on the bottom surface.

As described above, although the block bodies 100a to 100e are shown as examples of the block body 100 that can be applied to the temperature sensor 10 according to the present embodiment, the shape of the block body 100 is not limited to this. The optimum shape of the block body 100, can be appropriately selected according to the shape of the object to be measured.

[Modification 3]

A modification of the temperature sensor 10 according to the present embodiment is described with reference to FIGS. 5A and 5B. Here, a modification of the configuration of the surface shape of the block body 100 is mainly described.

Figure 5A:
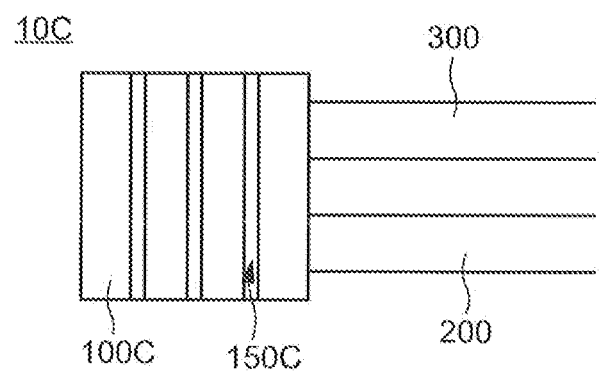
FIG. 5A is a schematic top view of a temperature sensor according to an embodiment of the present invention.
Figure 5B:
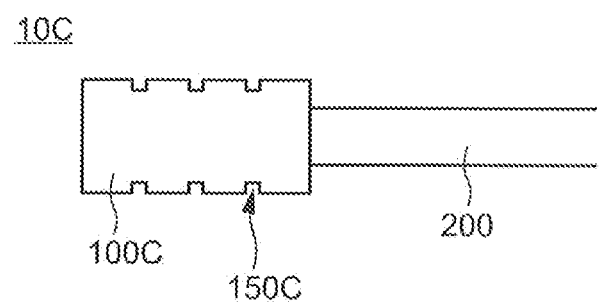
FIG. 5B is a schematic cross-sectional view of a temperature sensor according to an embodiment of the present invention.

FIGS. 5A and 5B are schematic top views and side views of a temperature sensor 100 according to the present embodiment, respectively. The temperature sensor 100 includes a block body 100C, the first thermocouple 200, and the second thermocouple 300. A groove 150C is provided on a surface of the block body 100C. In addition, one or more grooves 150C may be provided.

When the block body 100C is brazed to the object to be measured, the brazing enters the groove 150C so that the bonding can be strengthened. Further, since a surface area of the block body 100C is increased by providing the groove 150C, heat conduction from the object to be measured to the block body 100C is good.

A width, depth or number of the grooves 150C can be appropriately selected according to a size of the block body 100C. Further, the groove 150C may be provided with a taper toward the bottom surface.

In the block body 100C shown in FIGS. 5A and 5B, although the groove 150C is provided only on the upper surface and the bottom surface, the configuration of the groove 150C is not limited to this. The groove 150C may be provided on a part of the surface of the block body 100C, or may be provided on all the surfaces of the block body 100C.

In the block body 100C shown in FIGS. 5A and 5B, although the groove 150C is provided in a straight line, the configuration of the groove 150C is not limited to this. The groove 150C may be provided so as to include a curved line.

In the block body 100C shown in FIGS. 5A and 5B, although the groove 150C is continuously provided from one side surface to the other side surface on the opposite side, the configuration of the groove 150C is not limited to this. It is also possible to provide a groove only on a part of the surface of the block body 100C. Further, a plurality of grooves may be discontinuously provided on the surface of the block body 100C.

In the block body 100C shown in FIGS. 5A and 5B, although the groove 150C which extends in one direction is provided, the configuration of the groove 150C is not limited to this. Grooves which extend in a plurality of directions may be provided so that the grooves intersect. For example, the grooves may be provided in a grid pattern on the block body 100C.

In the block body 100C shown in FIGS. 5A and 5B, although a cross-sectional shape of the groove 150C is rectangular, the configuration of the groove 150C is not limited to this. The cross-sectional shape of the groove 150C may be a polygon such as a triangle or a pentagon, a semicircular shape, or a semi-elliptical shape.

In the temperature sensor 100 according to the present embodiment, the surface area of the block body 100C is increased by providing the groove 150C on the block body 100C. Therefore, a contact area with the object to be measured also increases, and heat conduction from the object to be measured to the block body 100C is improved. Therefore, the temperature sensor 100 has excellent responsiveness.

[Modification 4]

A modification of the temperature sensor 10 according to the present embodiment is described with reference to FIGS. 6A to 6C. Here, another modification of the configuration of the surface shape of the block body 100 is mainly described.

Figure 6A:
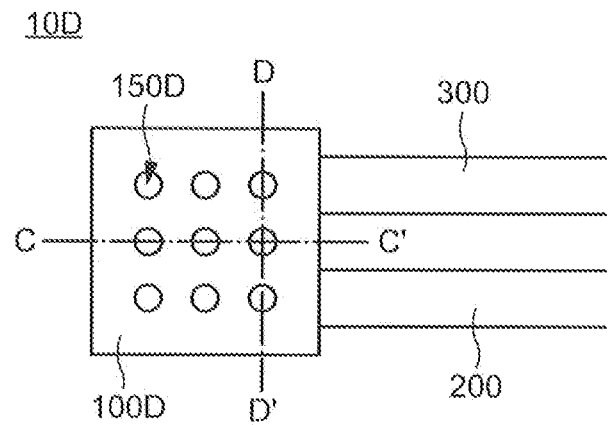
FIG. 6A is a schematic top view of a temperature sensor according to an embodiment of the present invention.

FIG. 6A is a schematic top view of a temperature sensor 10D according to the present embodiment. The temperature sensor 10D includes a block body 100D, the first thermocouple 200, and the second thermocouple 300.

Figure 6B:
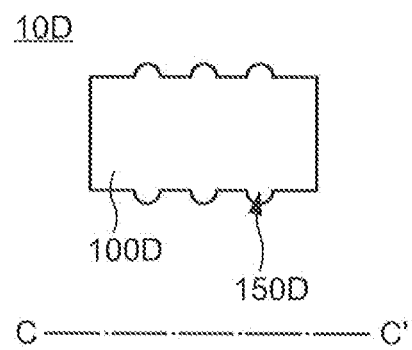
FIG. 6B is a schematic cross-sectional view of a temperature sensor according to an embodiment of the present invention.
Figure 6C:
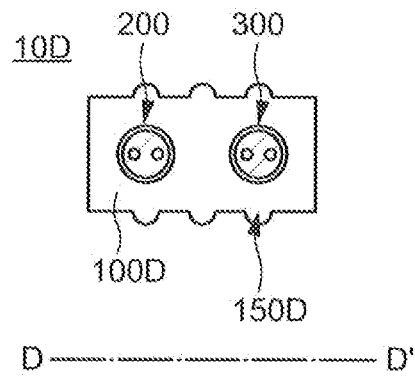
FIG. 6C is a schematic cross-sectional view of a temperature sensor according to an embodiment of the present invention.

FIGS. 6B and 6C show schematic cross-sectional views cut along a line C-C' and a line D-D' of FIG. 6A, respectively. A convex portion 150D is provided on a surface of the block body 100D. In addition, one or more convex portions may be provided.

When the block body 100D is bonded to the object to be measured, a surface area of the block body 100D is increased by providing the convex portion 150D, so that heat conduction from the object to be measured to the block body 100D is good.

A width, height or number of the convex portions 150D can be appropriately selected according to the size of the block body 100D.

In the block body 100D shown in FIGS. 6A to 6C, although the convex portion 150D is arranged in a matrix, the configuration of the convex portion 150D is not limited to this. The convex portion 150D can also be arranged in a staggered pattern or randomly on the block body 100.

In the block body 100D shown in FIGS. 6A to 6C, although the convex portion 150D is provided only on the upper surface and the bottom surface, the configuration of the convex portion 150D is not limited to this. The convex portion 150D may be provided on a part of the surface of the block body 100D, or may be provided on all the surfaces of the block body 100D.

In the block body 100D shown in FIGS. 6A to 6C, although the shape of the convex portion 150D is a hemisphere, the configuration of the convex portion 150D is not limited to this. The shape of the convex portion 150D may be a polygonal prism, a cylinder, a polygonal pyramid, or a cone.

In the block body 100D shown in FIGS. 6A to 6C, although a cross-sectional shape of the convex portion 150D is circular, the configuration of the convex portion 150D is not limited to this. The cross-sectional shape of the convex portion 150D may be a polygon such as a triangle or a quadrangle, or a semi-elliptical shape.

Further, although not shown in figures, the block body 100 may be blasted to provide fine irregularities on the surface.

In the temperature sensor 10D according to the present embodiment, the surface area of the block body 100D is increased by providing the convex portion 150D on the block body 100D. Therefore, a contact area with the object to be measured also increases, and the thermal conductivity from the object to be measured to the block body 100D is improved. Therefore, the temperature sensor 10D has excellent responsiveness.

[Modification 5]

A modification of the temperature sensor 10 according to the present embodiment is described with reference to FIGS. 7A to 7C. Here, a modification of the configuration of the positions of the first thermocouple 200 and the second thermocouple 300 buried in the block body 100 is mainly described.

Figure 7A:
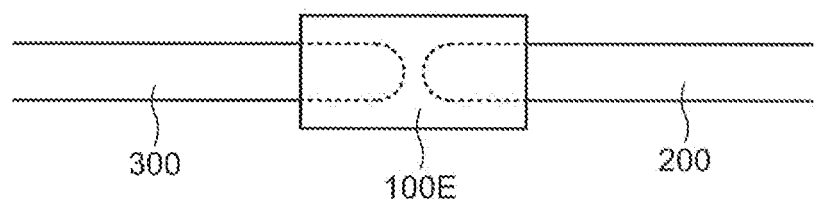
FIG. 7A is a schematic top view of a temperature sensor according to an embodiment of the present invention.

FIG. 7A is a schematic top view of a temperature sensor 10E according to the present embodiment. The temperature sensor 10E includes a block body 100E, the first thermocouple 200, and the second thermocouple 300. In the temperature sensor 10E, the first thermocouple 200 is buried in a first side surface of the block body 100E, and the second thermocouple 300 is buried in a second side surface opposite to the first side surface. Further, the first thermocouple 200 and the second thermocouple 300 are arranged in a straight line.

The temperature sensor 10E is formed by providing two openings in the block body 100E, passing the first thermocouple 200 through one opening, passing the second thermocouple 300 through the other opening, and bonding them by brazing or the like. Further, the temperature sensor 10E can also be manufactured by providing a through hole in the block body 100E, passing the first thermocouple 200 and the second thermocouple 300 from both sides of the through hole, and bonding them by brazing or the like. In this case, an end portion of the first thermocouple 200 and the end portion of the second thermocouple 300 may be in contact with each other inside the block body 100E.

Figure 7B:
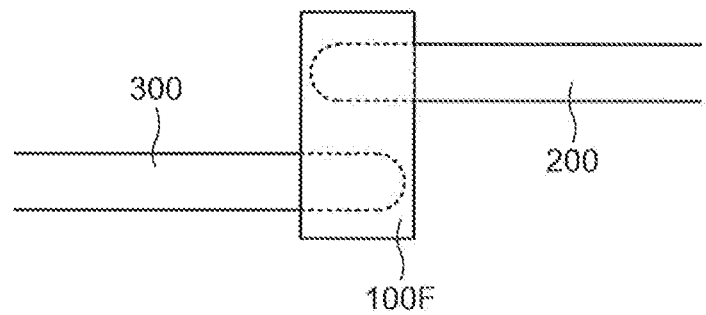
FIG. 7B is a schematic top view of a temperature sensor according to an embodiment of the present invention.

FIG. 7B is a schematic top view of a temperature sensor 10F according to the present embodiment. The temperature sensor 10F includes a block body 100F, the first thermocouple 200, and the second thermocouple 300. In the temperature sensor 10F, the first thermocouple 200 is buried in a first side surface of the block body 100F, and the second thermocouple 300 is buried in a second side surface opposite to the first side surface. Further, the first thermocouple 200 and the second thermocouple 300 are arranged so that a side surface of the first thermocouple 200 and a side surface of the second thermocouple 300 overlap each other inside the block body 100F. Inside the block body 100F, the side surface of the first thermocouple 200 and the side surface of the second thermocouple 300 can be in contact with each other.

Figure 7C:
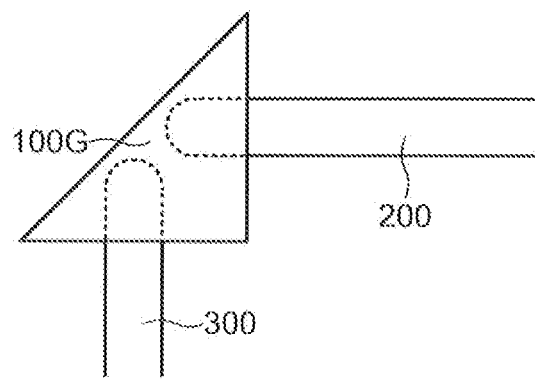
FIG. 7C is a schematic top view of a temperature sensor according to an embodiment of the present invention.

FIG. 7C is a schematic top view of a temperature sensor 10G according to the present embodiment. The temperature sensor 10G includes a block body 100G, the first thermocouple 200, and the second thermocouple 300. In the temperature sensor 10G, the first thermocouple 200 and the second thermocouple 300 are buried in the block body 100G so as to be orthogonal to each other. An angle between the first thermocouple 200 and the second thermocouple 300 is not limited to 90 degrees. The angle formed by the first thermocouple 200 and the second thermocouple 300 can be selected from 0 degrees to 180 degrees, according to necessity.

As described above, the temperature sensors 10E to 10G are shown as examples of the configuration of the positions of the first thermocouple 200 and the second thermocouple 300 buried in the block body 100. However, the shape of the block body can be changed similar to the block bodies 100E to 100G according to the positions of the first thermocouple 200 and the second thermocouple 300. Further, the configuration of the positions of the first thermocouple 200 and the second thermocouple 300 buried in the block body 100 is not limited to this. The positions of the first thermocouple 200 and the second thermocouple 300 buried in the block body 100 can be appropriately selected from an optimum shape according to the shape of the object to be measured.

In the present embodiment, although the temperature sensor including the thermocouple is exemplified, a resistance temperature detector may be used instead of the thermocouple. For example, two resistance temperature detectors can be buried in one block body, one resistance thermometer can measure the temperature of the substrate, and the other resistance temperature detector can control the heater. Further, in the present embodiment, a temperature sensor in which a thermocouple and a resistance temperature detector are buried in one block body is also possible. In either case, since the temperature is measured through the block body, the difference from the temperature measured by the thermocouple or the temperature measured by the resistance temperature detector can be reduced.

Second Embodiment

A heater unit according to an embodiment of the present invention is described with reference to FIGS. 8 to 10.

Figure 8:
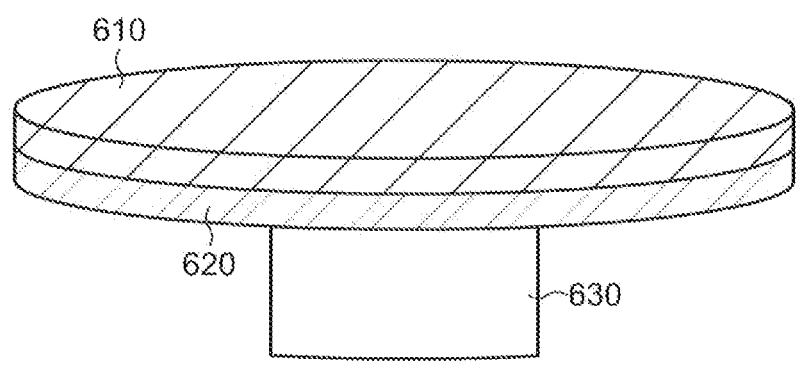
FIG. 8 is a schematic perspective view of a heater unit according to an embodiment of the present invention.

FIG. 8 is a schematic perspective views of a heater unit 20 according to the embodiment of the present invention. The heater unit 20 includes a first plate 610, a second plate 620, and a shaft 630.

Figure 9:
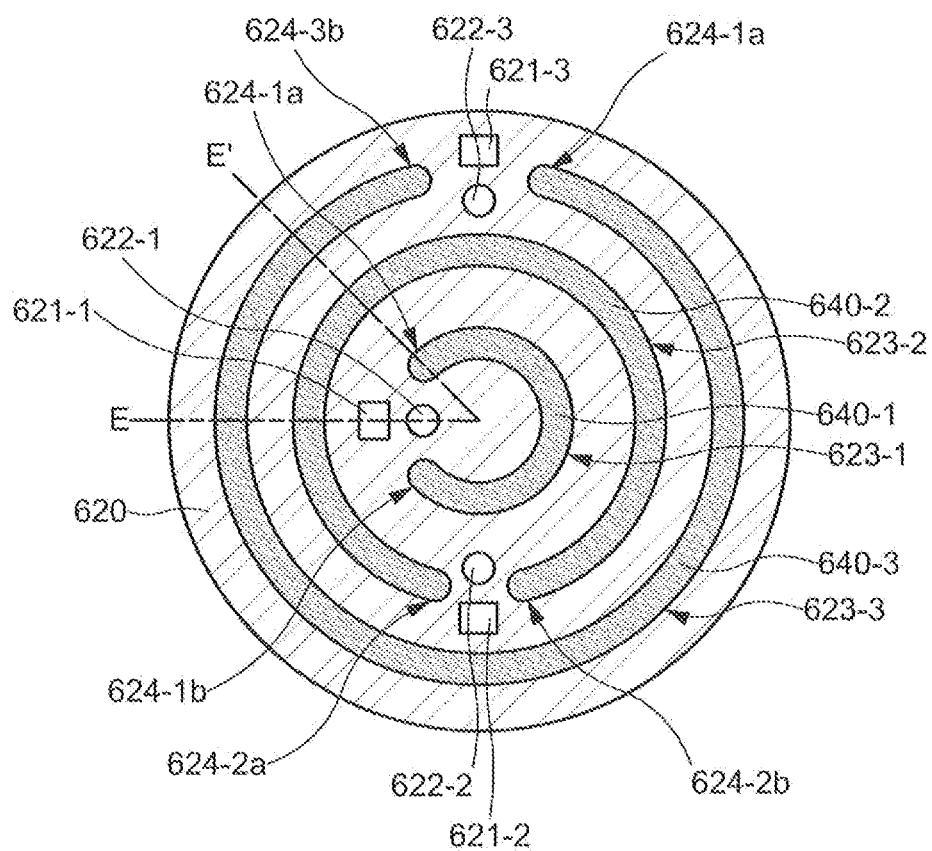
FIG. 9 is a schematic top view of a second plate of a heater unit according to an embodiment of the present invention.

FIG. 9 is a schematic top view of the second plate 620 of the heater unit 20 according to the embodiment of the present invention. The second plate 620 includes a first sheath heater 640-1, a second sheath heater 640-2, and a third sheath heater 640-3. That is, the heater unit 20 includes a sheath heater divided into three parts. Each sheath heater (640-1, 640-2, and 640-3) is provided along the grooves (623-1, 623-2, and 623-3) provided in the second plate 620. However, through holes (624-1a and 624-1b, 624-2a and 624-2b, and 624-3a and 624-3b) are provided at end portions, and each sheath heater (640-1, 640-2, and 640-3) is bent and stored in the shaft 630. Details of an arrangement of the sheath heaters (640-1, 640-2, and 640-3) and the grooves (623-1, 623-2, and 623-3) is described later.

Further, in the second plate 620, the temperature sensor 10 is arranged for each of the divided sheath heaters (640-1, 640-2, and 640-3). Therefore, the second plate 620 includes second recessed portions (621-1, 621-2, and 621-3) and through holes (622-1, 622-2, and 622-3) for arranging the three temperature sensors 10. In FIG. 9, the temperature sensor 10 is omitted.

A semiconductor substrate containing silicon or a compound semiconductor, or an insulating substrate containing an insulator such as quartz or glass, or the like is arranged on an upper surface of the first plate 610. Therefore, the upper surface of the first plate 610 can be formed according to the shape of the substrate. For example, in the case of a substrate having a flat surface, it is preferable to flatten the upper surface of the first plate 610. Further, if the substrate has irregularities, the upper surface of the first plate 610 may be shaped to match the irregularities of the substrate. The first plate 610 contains a metal, and the metal is selected from metals having a thermal conductivity of 10 W/mK or more and 430 W/mK or less. By using a metal having a high thermal conductivity, the thermal energy generated by each sheath heater (640-1, 640-2, and 640-3) can be efficiently received. Further, it is preferable that the metal has a coefficient of thermal expansion of $3 \times 10^{-6}$/K or more and $25 \times 10^{-6}$/K or less. Specific examples of the metal satisfying such characteristics include metals such as titanium, aluminum, and stainless steel. Although not shown in the figures, an electrostatic chuck for fixing the substrate, a through hole for supplying a gas with high thermal conductivity such as helium between the substrate and the heater unit 20, or a ring flow path for circulating a liquid medium can also be provided on the first plate 610.

The second plate 620 is provided below the first plate 610. The second plate 620 also contains the metal that can be used in the first plate 610. The metal contained in the second plate 620 and the metal contained in the first plate 610 may be the same or different. If they are different, the respective metals can be selected so that the difference in the coefficient of thermal expansion of the metals contained in the first plate 610 and the second plate 620 is $250 \times 10^{-6}$/K or less. As a result, deformation due to thermal expansion can be suppressed, and a highly reliable heater unit 20 can be provided.

The second plate 620 is bonded to the first plate 610. The bonding of the first plate 610 and the second plate 620 can be performed by brazing, welding, caulking, screwing, or the like. For example, aluminum, copper containing trace amounts of phosphorus, alloys containing aluminum, alloys containing silver, copper and zinc, alloys containing copper and zinc, alloys containing titanium, copper and nickel, alloys containing titanium, zirconium, and copper, alloys containing titanium, zirconium, copper, and nickel, or the like can be used for a brazing material.

The shaft 630 is provided to support the first plate 610 and the second plate 620. Further, the shaft 630 has a hollow structure in order to store a lead wire 641 for supplying electric power to the first sheath heater 640-1, the second sheath heater 640-2, and the third sheath heater 640-3, and the first thermocouple 200 and the second thermocouple 300 of the temperature sensor 10. When an electrostatic chuck is provided on the first plate 610, a wiring for supplying electric power to the electrostatic chuck is also arranged in the shaft 630. Although not shown in the figures, the shaft 630 may be connected to a rotation mechanism, whereby the heater unit 20 can be rotated about a long axis of the shaft 630. The shaft 630 is bonded to the second plate 620 by brazing, welding, caulking, screwing, or the like.

The first sheath heater 640-1, the second sheath heater 640-2, and the third sheath heater 640-3 have a function of generating heat when energized, and are provided for heating the second plate 620 and the first plate 610. As a result, the substrate installed on the heater unit 20 is heated.

As shown in FIG. 9, in the second plate 620, the first sheath heater 640-1 is arranged along the first groove 623-1, the second sheath heater 640-2 is arranged along the second groove 623-2, and the third sheath heater 640-3 is arranged along the third groove 623-3. Each of the first groove 623-1, the second groove 623-2, and the third groove 623-3 are arranged so as to be concentric as much as possible according to the shape of the second plate 620. By arranging the sheath heater along the concentric grooves, the temperatures of the first plate 610 and the second plate 620 become uniform, and the substrate on the first plate 610 can be heated uniformly. Further, the width and depth of the first groove 623-1 are the same as or substantially the same as a sheath outer diameter of the first sheath heater 640-1. The same applies to the width and depth of the second groove 623-2 and the third groove 623-3.

The first sheath heater 640-1 is bent at the through hole 624-1a and the through hole 624-1b and is stored in the shaft 630.

FIG. 10 is a schematic cross-sectional view of the heater unit 20 including the second plate 620 cut along a line E-E' of FIG. 9. The first plate 610 and the second plate 620 are bonded to each other, and a temperature sensor 10 including a block body 100, a first thermocouple 200, and a second thermocouple 300, a first sheath heater 640-1, a second sheath heater 640-2 and a third sheath heater 640-3 are provided between the first plate 610 and the second plate 620. The first thermocouple 200 and the second thermocouple 300 are bent at the through hole 622-1 of the second plate 620 and stored in the shaft 630. Further, the first sheath heater 640-1 is arranged along the first groove 623-1, bent at the through hole 624-1a, and stored in the shaft 630. The first sheath heater 640-1 is electrically connected to the lead strand 641, and the lead strand 641 is connected to the power supply.

The heater unit 20 includes a first recessed portion 611 in the first plate 610 and a second recessed portion 621 in the second plate 620. The block body 100 of the temperature sensor 10 is arranged and bonded in a region surrounded by the first recessed portion 611 and the second recessed portion 621. A depth of the first recessed portion 611 is larger than a depth of the second recessed portion 621. That is, an area in contact with the block body 100 is larger in the first plate 610 than in the second plate 620. Therefore, the temperature sensor 10 is more susceptible to the first plate 610 than the second plate 620.

Since the temperature sensor 10 of the heater unit 20 can measure the temperature of the first plate 610 close to the substrate, the temperature measured by the temperature sensor 10 is close to the actual temperature of the substrate. Further, since the first thermocouple 200 and the second thermocouple 300 can be bent, the temperature sensor 10 can be freely arranged in the second plate.

The configuration of the first sheath heater 640-1 has been mainly described above. However, since the configurations of the second sheath heater 640-2 and the third sheath heater 640-3 are the same, the description thereof is omitted here. Further, the number of sheath heaters is not limited to three. The number of sheath heaters provided in the heater unit 20 may be one or two, or four or more.

In the heater unit 20 according to the present embodiment, since the block body 100 of the temperature sensor 10 is in contact with the first plate 610, the temperature of the substrate on the first plate 610 can be measured through the block body 100. Further, since the block body 100 is also in contact with the second plate 620, the temperature of each sheath heater (640-1, 640-2, and 640-3) in the second plate 620 can also be measured through the block body 100. Therefore, the temperature of the substrate can be measured by using the first thermocouple 200 and the second thermocouple 300 buried in the block body 100, and the sheath heaters (640-1, 640-2, and 640-3) can be controlled to prevent overheating of each sheath heater (640-1, 640-2, and 640-3).

[Modification]

A modification of the heater unit 20 according to the present embodiment is described with reference to FIGS. 11A to 11C. Here, a modification of the arrangement of the temperature sensor 10 is mainly described. As described above, although the sheath heater can be divided into a plurality of parts, here, for convenience, the sheath heater 640 is described.

Figure 11A:
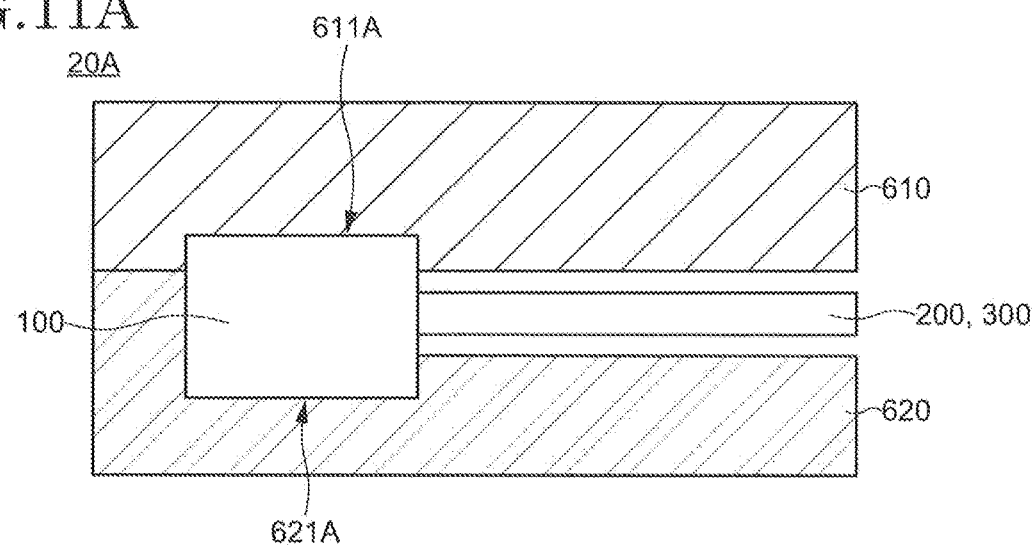
FIG. 11A is a schematic cross-sectional view of an arrangement portion of a temperature sensor of a heater unit according to an embodiment of the present invention.

FIG. 11A is a schematic cross-sectional view of an arrangement portion of the temperature sensor 10 of a heater unit 20A according to the embodiment of the present invention. The heater unit 20A includes a first recessed portion 611A in the first plate 610 and a second recessed portion 621A in the second plate 620. The block body 100 of the temperature sensor 10 is arranged and bonded in a region surrounded by the first recessed portion 611A and the second recessed portion 621A. A depth of the second recess 621A is larger than a depth of the first recessed portion 611A. That is, an area in contact with the block body 100 is larger in the second plate 620 than in the first plate 610. Therefore, the temperature sensor 10 is more susceptible to the second plate 620 than the first plate 610. Although the second plate 620 is provided with the sheath heater 640, abnormal heating of the sheath heater 640 can be detected.

Since the temperature sensor 10 of the heater unit 20A can measure the temperature of the second plate 620 provided with the heater, the temperature measured by the temperature sensor 10 is close to the actual temperature of the sheath heater 640. Therefore, abnormal heating of the sheath heater 640 can be detected. Further, since the first thermocouple 200 and the second thermocouple 300 can be bent, the temperature sensor 10 can be freely arranged in the second plate.

Figure 11B:
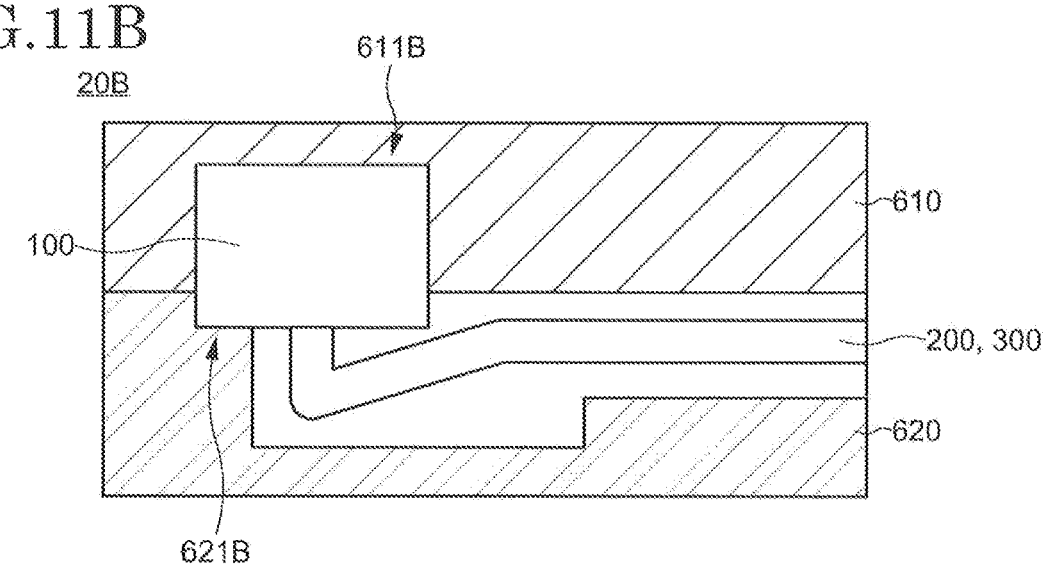
FIG. 11B is a schematic cross-sectional view of an arrangement portion of a temperature sensor of a heater unit according to an embodiment of the present invention.

FIG. 11B is a schematic cross-sectional view of an arrangement portion of the temperature sensor 10 of a heater unit 20B according to the embodiment of the present invention. The heater unit 20B includes a first recessed portion 611B in the first plate 610 and a second recessed portion 621B in the second plate 620. The block body 100 of the temperature sensor 10 is arranged and bonded in a region surrounded by the first recessed portion 611B and the second recessed portion 621B. Further, the second recessed portion 621B is provided with a hollow region for storing the first thermocouple 200 and the second thermocouple 300, and the first thermocouple 200 and the second thermocouple 300 are bent and stored. Therefore, an area in contact with the block body 100 is larger in the first plate than in the second plate, and the temperature sensor 10 is more susceptible to the influence of the first plate 610 than in the second plate 620.

Since the temperature sensor 10 of the heater unit 20B can measure the temperature of the first plate 610 close to the substrate, the temperature measured by the temperature sensor 10 is close to the actual temperature of the substrate. Further, since the first thermocouple 200 and the second thermocouple 300 can be bent, the temperature sensor 10 can be freely arranged in the second plate.

Figure 11C:
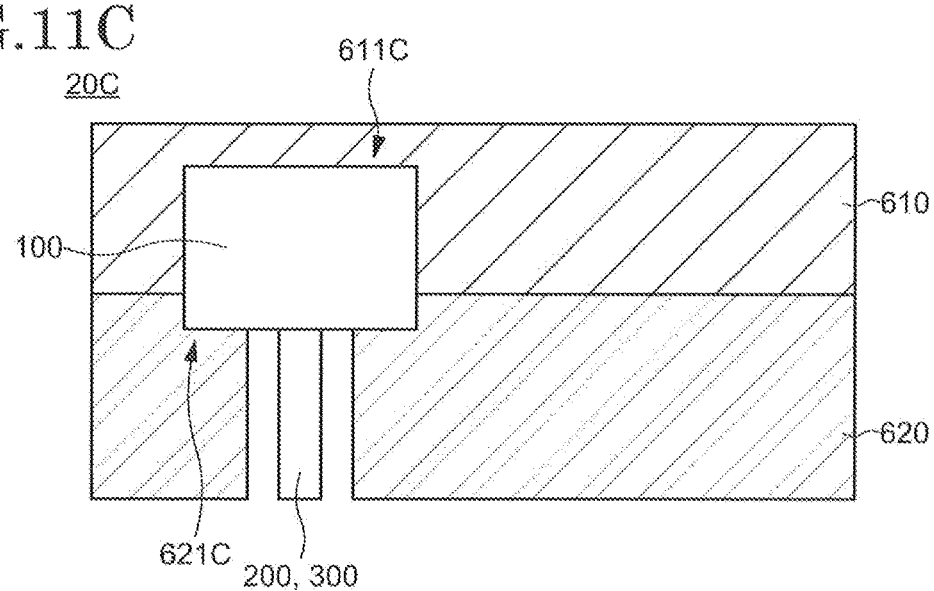
FIG. 11C is a schematic cross-sectional view of an arrangement portion of a temperature sensor of a heater unit according to an embodiment of the present invention.

FIG. 11C is a schematic cross-sectional view of an arrangement portion of the temperature sensor 10 of a heater unit 20C according to the embodiment of the present invention. The heater unit 20C includes a first recessed portion 611C in the first plate 610 and a second recessed portion 621C in the second plate 620. The block body 100 of the temperature sensor 10 is arranged and bonded in a region surrounded by the first recessed portion 611C and the second recessed portion 621C. A depth of the first recessed portion 611C is larger than a depth of the second recessed portion 621C. Further, a through hole for storing the first thermocouple 200 and the second thermocouple 300 is provided in the second recessed portion 621C. Therefore, an area in contact with the block body 100 is larger in the first plate 610 than in the second plate 620, and the temperature sensor 10 is more susceptible to the influence of the first plate 610 than in the second plate 620.

Since the temperature sensor 10 of the heater unit 20C can measure the temperature of the first plate 610 close to the substrate, the temperature measured by the temperature sensor 10 is close to the actual temperature of the substrate. Further, when the temperature sensor 10 is provided directly above the shaft 630, the first thermocouple 200 and the second thermocouple 300 can be directly stored in the shaft 630 through the through hole of the second plate 620.

As described above, although the heater units 20A to 20C have been shown as examples of the configuration of the arrangement of the temperature sensor 10 that can be applied to the heater unit 20 according to the present embodiment, the configuration of the arrangement of the temperature sensors 10 is not limited to this. The temperature sensor 10 in the heater unit 20 can be appropriately arranged at an optimum position according to the arrangement of the sheath heater 640 and the shapes of the first plate 610 and the second plate 620.

Each of the embodiments described above as an embodiment of the present invention can be appropriately combined and implemented as long as they do not contradict each other. Further, additions, deletion, or design changes of constituent elements based on the respective embodiments are also included within the scope of the present invention as long as the gist of the present invention is provided.

Other effects of the action which differ from those brought about by each of the above described embodiments, but which are apparent from the description herein or which can be readily predicted by those skilled in the art, are naturally understood to be brought about by the present invention.

What is claimed is:

1. A temperature sensor comprising:
   a block body;
   a first thermocouple comprising:
     a first strand;
     a second strand;
     a first insulator surrounding the first strand and the second strand; and
     a first metal sheath surrounding the first insulator; and
   a second thermocouple comprising:
     a third strand;
     a fourth strand;
     a second insulator surrounding the third strand and the fourth strand; and
     a second metal sheath surrounding the second insulator,
   wherein an end portion of each of the first thermocouple and the second thermocouple is buried in the block body, and
   wherein the second thermocouple has a different measurement temperature range from the first thermocouple.

2. The temperature sensor according to claim 1,
   wherein an end portion of each of the first strand and the second strand is in contact with the first metal sheath, and
   an end portion of each of the third strand and the fourth strand is in contact with the second metal sheath.

3. The temperature sensor according to claim 1,
   wherein an end portion of each of the first strand, the second strand, the third strand, and the fourth strand is in contact with the block body.

4. The temperature sensor according to claim 1,
   wherein the end portion of each of the first thermocouple and the second thermocouple is buried in the block body by brazing.

5. The temperature sensor according to claim 1,
   wherein the end portion of each of the first thermocouple and the second thermocouple is buried in the block body by welding.

6. The temperature sensor according to claim 1,
   wherein the end portion of each of the first thermocouple and the second thermocouple is buried in the block body by caulking.

7. The temperature sensor according to claim 1,
   wherein the block body has a shape selected from a group consisting of a polygonal prism shape, a cylindrical shape, a spherical shape, a polygonal pyramid shape, and a conical shape.

8. The temperature sensor according to claim 1,
   wherein a groove is provided on a surface of the block body.

9. The temperature sensor according to claim 1,
   wherein a convex portion is provided on a surface of the block body.

10. The temperature sensor according to claim 1,
    wherein a surface of the block body is provided with unevenness by blasting or etching.

11. The temperature sensor according to claim 1,
    wherein a material of the block body has a thermal conductivity of 10 W/mK or more and 430 W/mK or less.

12. A heater unit comprising the temperature sensor according to claim 1.

* * * * *